(12) United States Patent
Lee

(10) Patent No.: US 6,284,592 B1
(45) Date of Patent: Sep. 4, 2001

(54) METHOD FOR FABRICATING A SEMICONDUCTOR DEVICE

(75) Inventor: Wook-Ha Lee, Chungcheongbuk-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/517,162

(22) Filed: Apr. 5, 2000

(30) Foreign Application Priority Data

May 10, 1999 (KR) ................................................ 99-16575

(51) Int. Cl.$^7$ ............................................. H01L 21/8242
(52) U.S. Cl. ...................... 438/241; 438/239; 438/240; 438/242; 438/250; 438/251; 438/253
(58) Field of Search ..................................... 438/239, 240, 438/241, 242, 250–256, 393–399

(56) References Cited

U.S. PATENT DOCUMENTS

| 5,633,181 | * | 5/1997 | Hayashi | 438/234 |
| 6,015,730 | * | 1/2000 | Wang et al. | 438/241 |
| 6,130,102 | * | 10/2000 | White, Jr. et al. | 438/3 |

FOREIGN PATENT DOCUMENTS

0431522 A2 * 6/1991 (EP) ............................... H01L/21/82

* cited by examiner

*Primary Examiner*—John F. Niebling
*Assistant Examiner*—Jennifer M. Kennedy

(57) ABSTRACT

A method for fabricating a semiconductor device, comprises the steps of: forming a field oxide layer on a first conduction type semiconductor substrate having a cell area and a peripheral circuit area, the field oxide layer defining active and field regions in the device; respectively forming first and second gates having capping layers thereon in the cell and peripheral circuit areas after placing a gate insulating layer on the semiconductor substrate; forming first and second impurity regions respectively in the cell and peripheral circuit areas by ion-implantation of a second conduction type impurity using the capping layers as a mask; forming an etching stop layer on the semiconductor substrate to cover the field oxide layer and sides of the first and second gates, forming a sacrificing layer on the etching stop layer, and forming a contact hole exposing the first impurity region; forming a plug contacting with the first impurity region within the contact hole and removing the remaining sacrificing layer to expose a top of the plug and the etching stop layer; forming a third side wall spacer on an exposed side of the top of the plug while forming first and second side wall spacers such that the etching stop layer is respectively interposed between the first and second side wall spacers and the sides of the second and first gates; and forming a third impurity region to be superposed on the second impurity region of the peripheral circuit area, using the capping layer and the first side wall spacer as the mask.

17 Claims, 6 Drawing Sheets

Figure 1E:
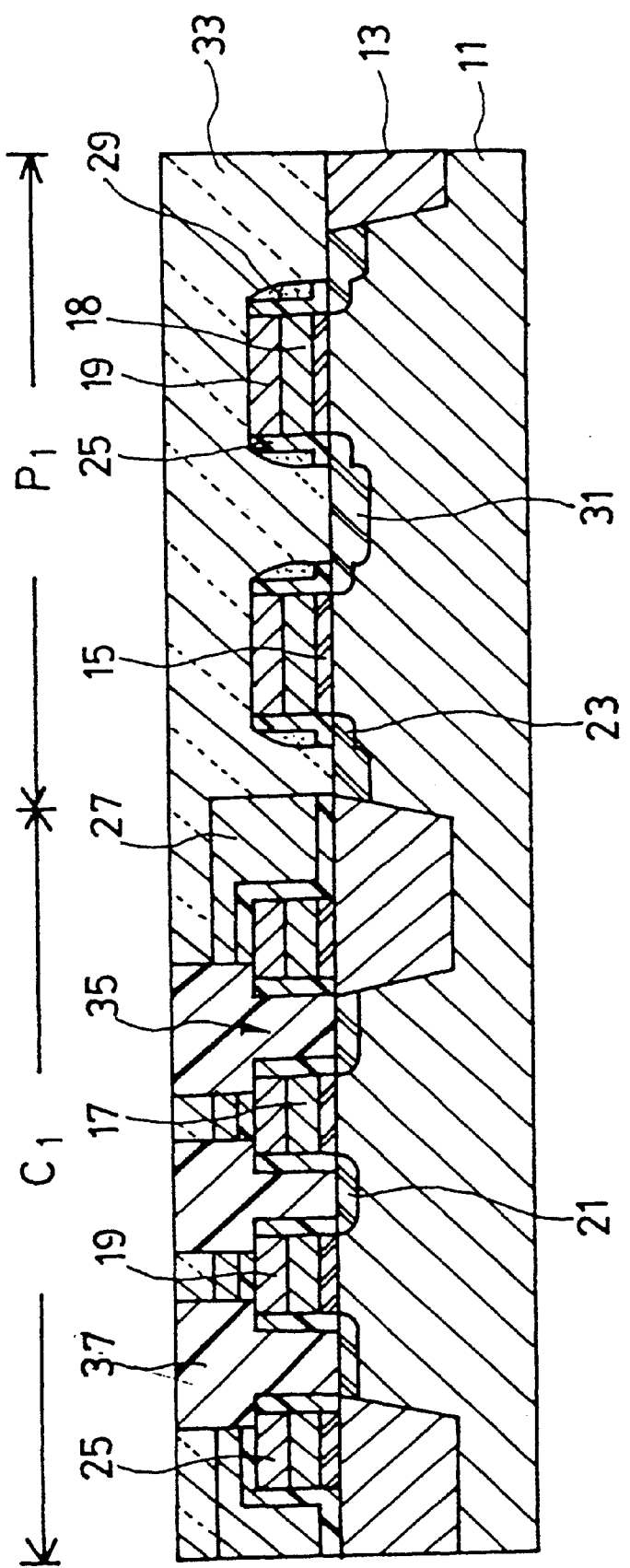

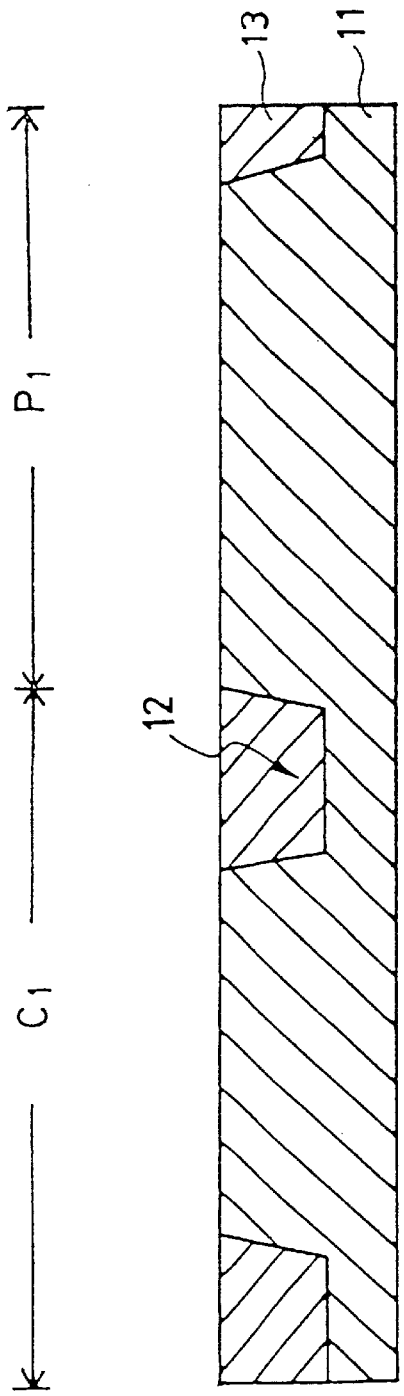
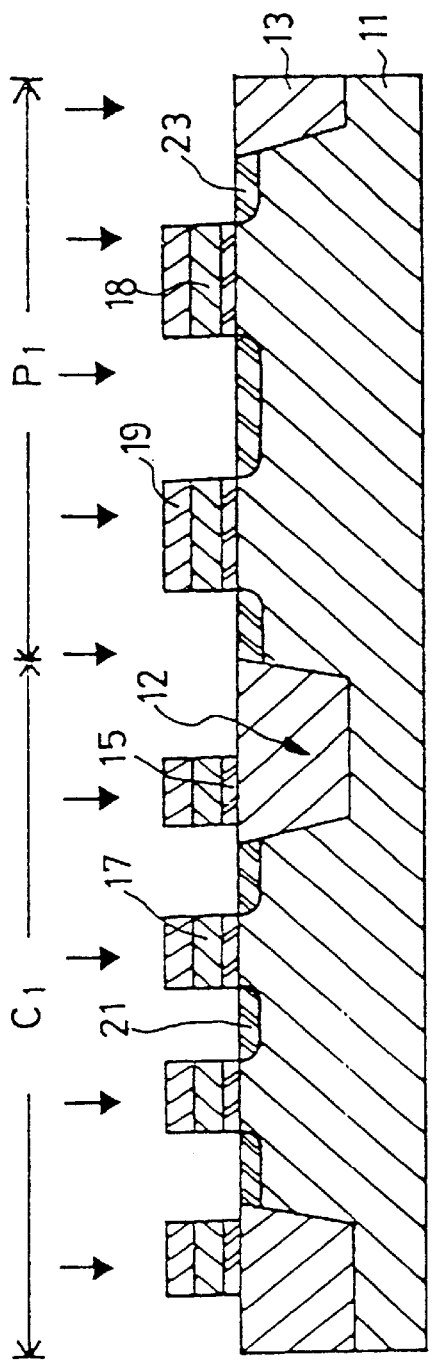

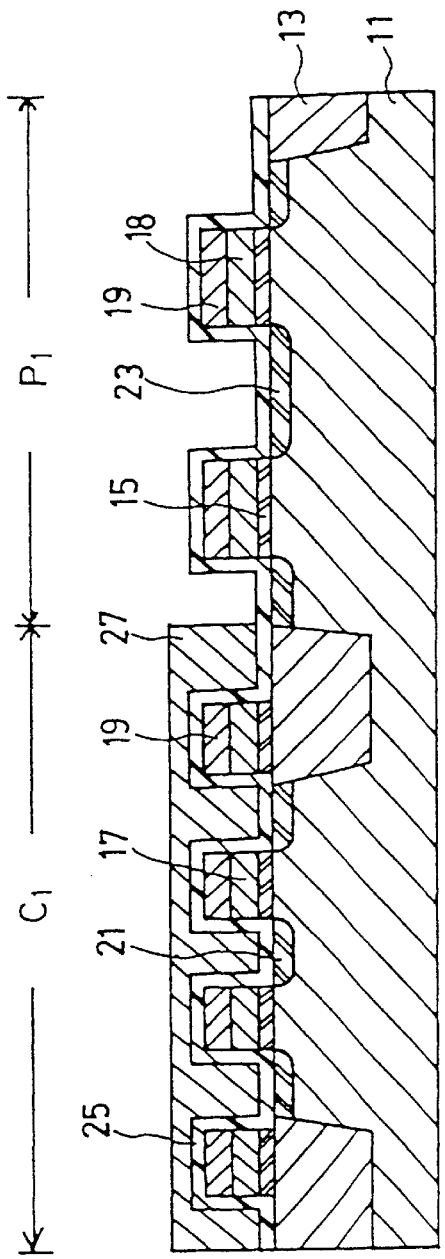
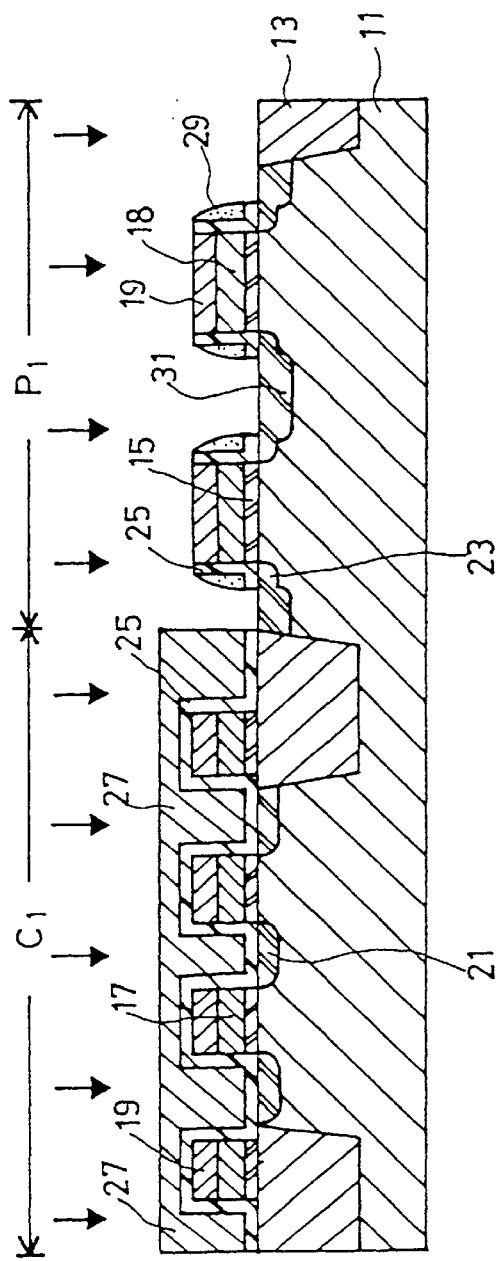

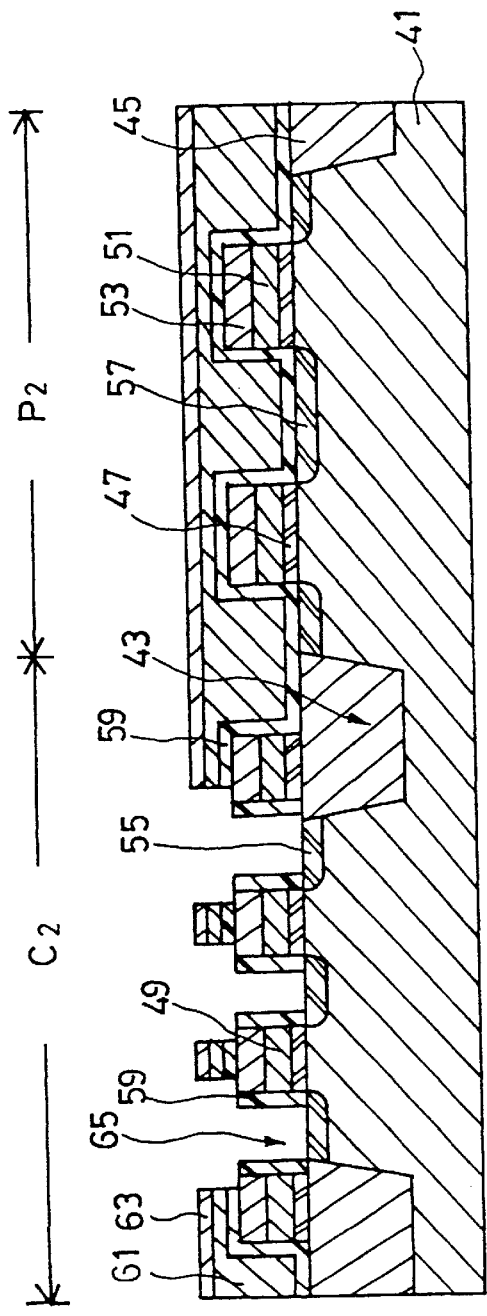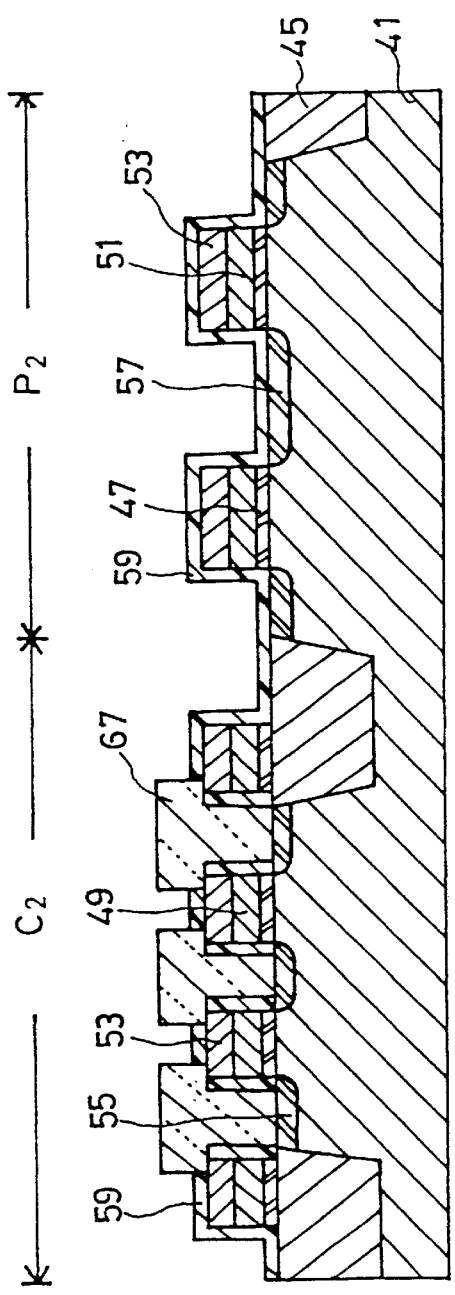

METHOD FOR FABRICATING A SEMICONDUCTOR DEVICE

BACKGROUND OF THE INVENTION

1. Field of the Invention

The present invention relates to a method for fabricating a semiconductor device and more particularly to a method for fabricating a semiconductor device in which a plug is self-aligned and comes into contact with an impurity region composing a memory device within a cell area.

2. Description of Related Art

As the degree of integration of a semiconductor device increases, the size of a unit transistor decreases, and accordingly, the size of an impurity region serving as source and drain regions decreases. Consequently, the size of a contact hole for connecting the impurity region to a storage electrode of a capacitor or a bit line decreases. The contact hole decreases not in thickness but in size, so the ratio of length to breadth of the contact hole increases. Accordingly, it becomes difficult to form the contact hole for exposing the impurity region and connecting the impurity region to the storage electrode of the capacitor or the bit line. Furthermore, it is difficult to form the storage electrode of the capacitor or the bit line within the contact hole. These problems caused by the increase in the ratio of length to breadth of the contact hole appear more seriously in a memory device formed within the cell area of a smaller size than in a driver circuit device formed within a peripheral circuit area of a larger size.

To solve these problems, techniques are developed for forming at least two contact holes for formation of the storage electrode of the capacitor or the bit line in the memory device within the cell area, that is, for forming a plug in a lower contact hole exposing the impurity region and forming the storage electrode of the capacitor or the bit line to come into contact with the plug in an upper contact hole. The at least two contact holes including the lower and upper contact holes are reduced in their depth, as compared with the contact hole that is typically formed through a single process. According to the above techniques, the ratio of length to breadth of the contact hole is decreased, thereby allowing easy formation of the storage electrode of the capacitor and the bit line as well as the contact hole.

FIGS. 1A to 1E are diagrammatic illustrations showing a method for fabricating a semiconductor device according to a prior art.

Referring to FIG. 1A, a field oxide layer 13 is formed by STI (shallow trench isolation) on a p type semiconductor substrate 11 including a cell area C1 and a peripheral circuit area P1 to define active region and field region. The field oxide layer 13 is formed in such a manner that a pad oxide layer (not shown) and a masking film (not shown) are formed to expose a specified portion of the semiconductor substrate 11, subsequently, a trench 12 is formed at a predetermined angle at the exposed portion of the semiconductor substrate 11 by anisotropic etching such as RIE (reactive ion etching), the trench 12 is filled with silicon oxide, and then the masking film and the pad oxide layer are removed.

Referring to FIG. 1B, a gate insulating layer 15 is placed on the exposed portion of the semiconductor substrate 11 to form first and second gates 17 and 18 and capping layers 19 thereon. The first and second gates 17 and 18 and the capping layers 19 are formed in such a manner that, after forming the gate insulating layer 15 by thermal oxidizing the exposed portion of the semiconductor substrate 11, polysilicon and silicon nitride are deposited on the gate insulating layer 15 by CVD (chemical vapor deposition) and then patterned by photolithography including the anisotropic etching such as RIE. The first and second gates 17 and 18 may be formed in a double layers structure of polysilicon and silicide, and the capping layer 19 may be formed of silicon oxide.

An n type impurity is ion-implanted into the exposed portion of the semiconductor substrate 11 at a low dose using the capping layer 19 as a mask to form first and second impurity regions 21 and 23 in the cell area C1 and peripheral circuit area P1 respectively. The first impurity region 21 formed in the cell area C1 is used as source and drain regions composing the memory device together with the first gate 17. The second impurity region 23 formed in the peripheral circuit area P1 is used as a lightly doped drain (LDD) of the driver circuit device including the second gate 18.

Referring to FIG. 1C, silicon nitride is deposited over the entire surface of the resultant structure described above by the CVD to form an etching stop layer 25. An insulating material such as BPSG (boro phospho silicate glass) is deposited on the etching stop layer 25 to form a planerization layer 27. Because the BPSG composing the planarization layer 27 has a good fluidity, it not only fills a gap between the first and second gates 17 and 18 but also planarizes the surface of the resultant structure.

The planarization layer 27 in the peripheral circuit area P1 is patterned by the photolithography including the anisotropic etching such as RIE, thereby exposing the etching stop layer 25. At this time, the etching stop layer 25 is not removed because its etching selection ratio is different from that of the planarization layer 27. Accordingly, the etching stop layer 25 prevents the semiconductor substrate 11 and the filed oxide layer 13 from being etched during the patterning of the planarization layer 27.

Referring to FIG. 1D, a side wall spacer 29 is formed by the side of the second gate 18. The side wall spacer 29 is formed in such a manner that silicon oxide is deposited on the etching stop layer 25 and the planarization layer 27 by the CVD and then etched back by the RIE or the like. At this time, an exposed portion of the etching stop layer 25 in the peripheral circuit area P1 is etched, thereby exposing the semiconductor substrate 11 and the capping layer 19.

An n type impurity is ion-implanted into the exposed portion of the semiconductor substrate 11 at a high dose to be superposed on the second impurity region 23 by using the capping layer 19 and the side wall spacer 29 as the mask to form a third impurity region 31 which serves as source and drain regions of the driver circuit device including the second gate 18 and the second impurity region 23.

Referring to FIG. 1E, an interlevel insulating layer 33 is formed by depositing silicon oxide over the planarization layer 27 and the driver circuit device including the second gate 18 and the second and third impurity regions 23 and 31 in the peripheral circuit area P1 through the CVD. Because a step difference between the cell area C1 and the peripheral circuit area P1 is large due to the planarization layer 27, the interlevel insulating layer 33 is formed in thickness of 1 μm to reduce the step difference between the cell area C1 and the peripheral circuit area P1.

A photoresist (not shown) is formed on the portion of interlevel insulating layer 33 corresponding to the peripheral circuit area P1 and then an exposed portion of the cell area C1 is etched back by the RIE to remove the step difference, thereby planarizing the entire surface. The remaining interlevel insulating layer 33 is removed by chemical-mechanical polishing (CMP). As a result, the interlevel insulating layer 33 in the cell area C1 is left only in thickness of about 1000~2000 Å.

Portions of the interlevel insulating layer 33, the planarization layer 27, and the etching stop layer 25 corresponding to the first impurity region 21 within the cell area C1 are sequentially patterned by the photolithography including the anisotropic etching such as RIE to form a contact hole 35 exposing the first impurity region 21.

Polysilicon is deposited on the interlevel insulating layer 33 by the CVD, thereby filling the contact hole 35 and coming into contact with the first impurity region 21. A plug 37 is formed in such a manner that the polysilicon is etched back by the RIE or the CMP, exposing the interlevel insulating layer 33 and leaving the polysilicon only in the contact hole 35.

In the conventional method for fabricating a semiconductor device as described above, since the planarization layer must be patterned to form the side wall spacer by the side of the second gate in the peripheral circuit area and the planarization layer of the peripheral circuit area must be formed to planarize the interlevel insulating layer that is formed on the patterned structure thinly, fabricating processes are complicated. Furthermore, the conventional method uses the CMP to form the thin interlevel insulating layer, which makes it difficult to control the thickness precisely, thereby limiting the thinness of the interlevel insulating layer. This increases the ratio of length to breadth of the contact hole, thereby making it difficult to form the plug.

SUMMARY OF THE INVENTION

Accordingly, the present invention is directed to a method for fabricating a semiconductor device that substantially obviates one or more of the limitations and disadvantages of the related art.

An objective of the present invention is to provide a method for fabricating a semiconductor device, which facilitates fabricating processes by forming a plug within a cell area and forming a side wall spacer by the side of a second gate in a peripheral circuit area under the state that the area related to the plug is not covered.

Another objective of the present invention is to provide a method for fabricating a semiconductor device, which forms a plug before forming a planarization layer, thereby reducing the ratio of length to breadth of a contact hole and allowing easy formation of the plug.

A still another objective of the present invention is to provide a method for fabricating a semiconductor device, which allows easy planarization.

Additional features and advantages of the invention will be set forth in the following description, and in part will be apparent from the description, or may be learned by practice of the invention. The objectives and other advantages of the invention will be realized and attained by the structure as illustrated in the written description and claims hereof, as well as the appended drawings.

To achieve these and other advantages, and in accordance with the purpose of the present invention as embodied and broadly described, a method for fabricating a semiconductor device, comprises the steps of: forming a field oxide layer on a first conduction type semiconductor substrate having a cell area and a peripheral circuit area, the field oxide layer defining active and field regions in the device; respectively forming first and second gates having capping layers thereon in the cell and peripheral circuit areas after placing a gate insulating layer on the semiconductor substrate; forming first and second impurity regions respectively in the cell and peripheral circuit areas by ion-implantation of a second conduction type impurity using the capping layers as a mask; forming an etching stop layer on the semiconductor substrate to cover the field oxide layer and sides of the first and second gates, forming a sacrificing layer on the etching stop layer, and forming a contact hole exposing the first impurity region; forming a plug contacting with the first impurity region within the contact hole and removing the remaining sacrificing layer to expose a top of the plug and the etching stop layer; forming a third side wall spacer on an exposed side of the top of the plug while forming first and second side wall spacers such that the etching stop layer is respectively interposed between the first and second side wall spacers and the sides of the second and first gates; and forming a third impurity region to be superposed on the second impurity region of the peripheral circuit area, using the capping layer and the first side wall spacer as the mask.

In another embodiment of the present invention, a method for fabricating a semiconductor device, comprises the steps of: forming a field oxide layer on a first conduction type semiconductor substrate having a cell area where a memory device will be formed and a peripheral circuit area where a driver circuit device will be formed, the field oxide layer defining active and field regions in the device; respectively forming first and second gates having capping layers thereon in the cell and peripheral circuit areas after placing a gate insulating layer on the semiconductor substrate; forming a first impurity region which serves as source and drain regions in the cell area, and a second impurity region which serves as a lightly doped drain (LDD) region of the driver circuit device in the peripheral circuit area, by ion-implantation of a second conduction type impurity using the capping layers as a mask; forming an etching stop layer on the semiconductor substrate to cover the field oxide layer and sides of the first and second gates and forming a sacrificing layer on the etching stop layer to fill a gap between the first and second gates and planarize a surface; forming a contact hole by patterning the sacrificing layer and the etching stop layer in a self-alignment manner to expose the first impurity region; forming a plug contacting with the first impurity region within the contact hole and removing the remaining sacrificing layer to expose a top of the plug and the etching stop layer; forming a third side wall spacer on an exposed side of the top of the plug while forming first and second side wall spacers such that the etching stop layer is respectively interposed between the first and second side wall spacers and the sides of the second and first gates; and forming a third impurity region to be superposed on the second impurity region of the peripheral circuit area, using the capping layer and the first side wall spacer as the mask, the third impurity region serving as source and drain regions of the driver circuit device.

In further another embodiment of the present invention, a method for fabricating a semiconductor device, the method comprising the steps of: forming a field oxide layer on a first conduction type semiconductor substrate having a cell area where a memory device will be formed and a peripheral circuit area where a driver circuit device will be formed, the field oxide layer defining active and field regions in the device; respectively forming first and second gates having capping layers thereon in the cell and peripheral circuit areas after placing a gate insulating layer on the semiconductor substrate; forming a first impurity region which serves as source and drain regions in the cell area, and a second impurity region which serves as a lightly doped drain (LDD) region of the driver circuit device in the peripheral circuit area, by ion-implantation of a second conduction type impurity using the capping layers as a mask; forming an etching stop layer on the semiconductor substrate to cover the field oxide layer and sides of the first and second gates and forming a sacrificing layer on the etching stop layer to fill a gap between the first and second gates and planarize a surface; forming a contact hole by patterning the sacrificing layer and the etching stop layer in a self-alignment manner to expose the first impurity region; forming a plug contacting with the first impurity region within the contact hole and removing the remaining sacrificing layer to expose a top of the plug and the etching stop layer; forming a third side wall spacer on an exposed side of the top of the plug while forming first and second side wall spacers such that the etching stop layer is respectively interposed between the first and second side wall spacers and the sides of the second and first gates; and forming a buffer layer over an entire surface of a structure described above and forming a third impurity region to be superposed on the second impurity region of the peripheral circuit area, using the capping layer and the first side wall spacer as the mask.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 1A to 1E are diagrammatic illustrations showing a method for fabricating a semiconductor device according to a prior art; and FIGS. 2A to 2E are diagrammatic illustrations showing a method for fabricating a semiconductor device according to the present invention.

DETAILED DESCRIPTION OF PREFERRED EMBODIMENT

Reference will now be made in detail to the preferred embodiments of the present invention, examples of which are illustrated in the accompanying drawings.

With reference to the accompanying drawings, the present invention will be described in detail.

FIGS. 2A to 2E show a method for fabricating a semiconductor device according to the present invention.

Figure 2A:
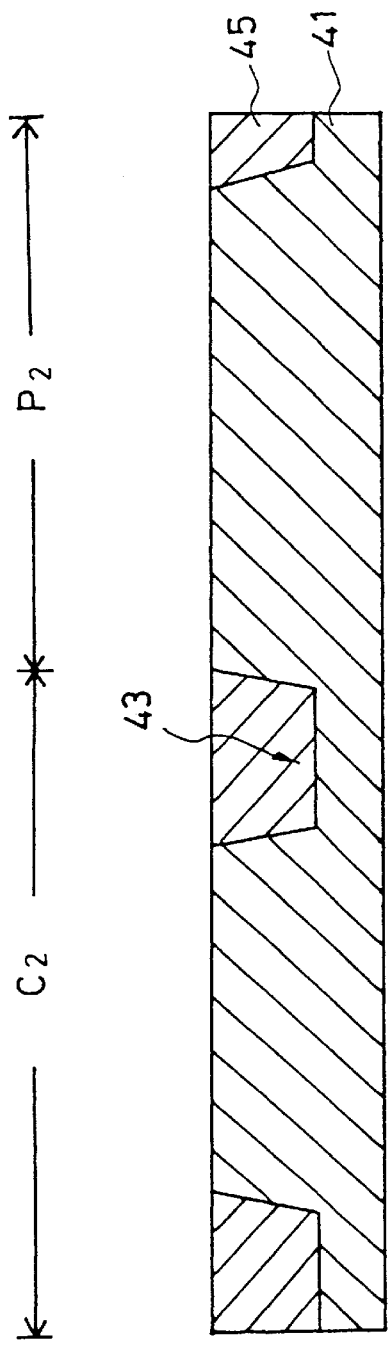

Referring to FIG. 2A, a field oxide layer 45 is formed by STI on a p type semiconductor substrate 41 including a cell area C2 and a peripheral circuit area P2 to define active regions and field regions. Here, the field oxide layer 45 is formed in such a manner that a pad oxide layer (not shown) and a masking film (not shown) are formed to expose a specified portion of the semiconductor substrate 41; subsequently, a trench 43 is formed at a predetermined angle by anisotropic etching such as RIE (reactive ion etching) on the exposed portion of the semiconductor substrate 41, and silicon oxide is deposited by CVD on the masking film to fill the trench 43 and then etched back to be left only in the trench 43, thereby forming the field oxide layer and removing the masking film and the pad oxide layer.

Figure 2B:
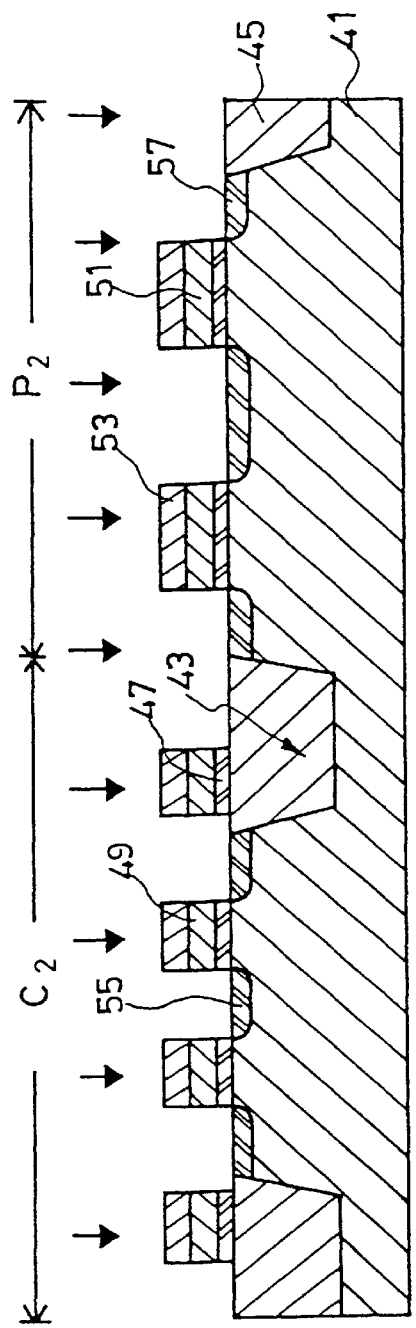

Referring to FIG. 2B, a gate insulating layer 47 is placed on the exposed portion of the semiconductor substrate 41 to form first and second gates 49 and 51 and the capping layers 53 thereon. Here, the first and second gates 49 and 51 and the capping layers 53 are formed in such a manner that, after forming the gate insulating layer 47 by thermal oxidizing the exposed portion of the semiconductor substrate 41, polysilicon and silicon oxide is deposited by the CVD on the gate insulating layer 47 and then patterned by photolithography including the anisotropic etching such as RIE. The first and second gates 49 and 51 are respectively formed in the cell area C2 and the peripheral circuit area P2 and respectively composes a memory device and a driver circuit device. They may be formed in a dual structure of polysilicon and silicide. The capping layers 53 are formed on the first and second gates 49 and 51. They may be formed of silicon nitride.

An n type impurity such as phosphorous (P) or arsenic (As) is ion-implanted into the exposed portion of the semiconductor substrate 41 at energy of 10~50 KeV at a low dose of $1 \times 10^{13} \sim 1 \times 10^{14}$ ion/cm$^2$, using the capping layer 53 as a mask, thereby forming first and second impurity regions 55 and 57 in the cell area C2 and the peripheral circuit area P2 respectively. The first impurity region 55 formed in the cell area C2 is used as source and drain regions composing the memory device together with the first gate 49. The second impurity region 57 formed in the peripheral circuit area P2 is used as an LDD of the driver circuit device including the second gate 51.

Referring to FIG. 2C, silicon nitride is deposited by the CVD on the entire surface of the resultant structure described above in thickness of about 200~800 Å, covering the sides of the semiconductor substrate 41 and first and second gates 49 and 51, thereby forming an etching stop layer 59. A sacrificing layer 61 is formed on the etching stop layer 59. The sacrificing layer 61 is formed of an insulating material, such as BPSG, PSG (phospho silicate glass), or BSG (boro silicate glass), having a good fluidity not only to fill a gap between the first and second gates 49 and 51 but also to planerize the surface. The sacrificing layer 61 is formed with only a single layer, which decreases the height of the cell area C2.

Portions of the sacrificing layer 61 and etching stop layer 59 corresponding to the first impurity region 55 of the cell area C2 are patterned by the photolithography including the anisotropic etching such as RIE to form a contact hole 65 exposing the first impurity region 55. At this time, the etching stop layer 59 on the sides of the first and second gates 49 and 51 is not removed but used as a side wall. Since the sacrificing layer 61 has a different etching selection ratio from the etching stop layer 59, the contact hole 65 can be formed in a self-alignment manner. The etching stop layer 59 has a different etching selection ratio from the sacrificing layer 61, thereby preventing the field oxide layer 43 from being etched. At this point, since the height of the cell area C2 is relatively low, the contact hole 65 can be easily formed and the ratio of length to breadth of the contact hole 65 is reduced.

Referring to FIG. 2D, polysilicon is deposited by the CVD on the sacrificing layer 61, filling the contact hole 65 and coming into contact with the first impurity region 55. Since the ratio of length to breadth of the contact hole 65 is small, it is easy to fill the contact hole 65 with the polysilicon. The polysilicon is etched back by RIE or CMP to be left only in the contact hole 65, exposing the sacrificing layer 61, to form a plug 67. The plug 67 can be formed of metal such as tungsten (W), titanium (Ti), cobalt (Co), platinum (Pt), or tantalum (Ta) other than the polysilicon mentioned above.

The sacrificing layer 61 left on the cell area C2 and the peripheral circuit area P2 is selectively removed by wet etching to expose the etching stop layer 59. The sacrificing layer 61 can be removed by combination of wet etching and dry etching. By doing so, the side portion of the plug 67 formed on the etching stop layer 59 is exposed.

Figure 2E:
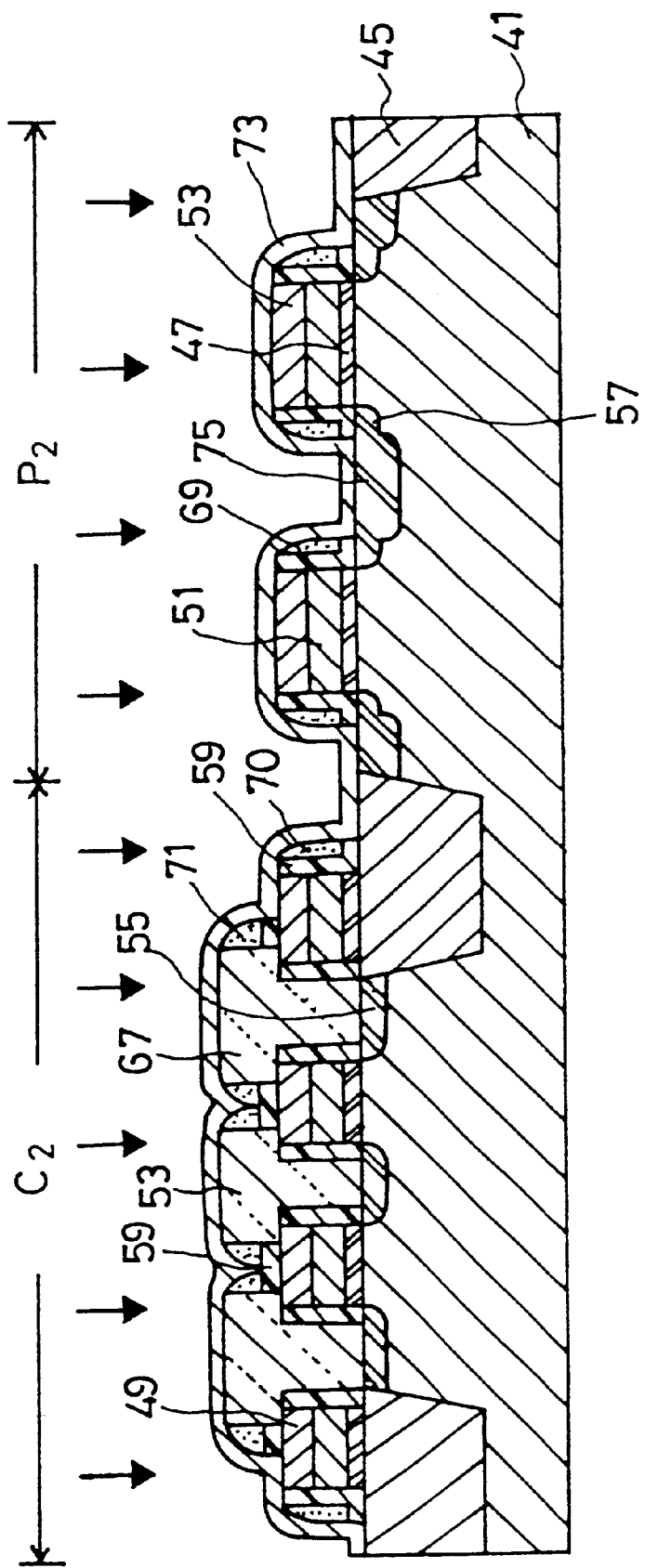

Referring to FIG. 2E, silicon oxide is deposited by the CVD on the entire surface of the structure described above and then etched back by the RIE or the like to form a first side wall spacer 69 by the side of the second gate 51 with the etching stop layer 59 being interposed between the side of the second gate 51 and the first side wall spacer 69. At this time, an exposed portion of the etching stop layer 59 in the peripheral circuit area P2 is also etched, thereby exposing the semiconductor substrate 41 and the capping layer 53. When the first side wall spacer 69 is formed by the side of the second gate 51, a second side wall spacer 70 is formed by the side of the first gate 49 with the etching stop layer 59 being interposed between the second side wall spacer 70 and the first gate 49, and a third side wall spacer 71 is formed on the exposed side of the plug 67 in the cell area C2. The etching stop layer 59 prevents the semiconductor substrate 41 and the field oxide layer 45 from being damaged when forming the first, second, and third side wall spacers 69, 70, and 71.

Silicon oxide is deposited by the CVD on the entire surface of the structure described above in thickness of about 300~1000 Å to form a buffer layer 73. An n type impurity such as P or As is ion-implanted at energy of approximately 20~100 Kev at a high dose of approximately $1\times10^{13}$~$1\times10^{14}$ ion/cm$^2$ by using the capping layer 53 and the first side wall spacer 69 as a mask, thereby forming a third impurity region 75 superposed on the second impurity region 57 of the peripheral circuit area P2. The buffer layer 73 prevents the surface of the semiconductor substrate 41 composing the third impurity region 75 from being damaged by the implanted impurity ion. This prevents flow of leakage current.

BPSG and the like and silicon oxide by the CVD is sequentially deposited on the buffer layer 73 to form a planarization layer (not shown) and an interlevel insulating layer (not shown). The plug is then exposed by patterning the planarization layer and the interlevel insulating layer to form a contact hole for the formation of a storage electrode of a capacitor or a bit line. The buffer layer 73 prohibits boron (B) or P contained in the BPSG and the like forming the planarization layer from being doped into the device. This prevents deterioration of the reliability of the device. As described above, since the planarization layer is formed after forming the plug and special patterning is not needed, a special step of planerizing the interlevel insulating layer is not needed.

As illustrated above, in the method for fabricating a semiconductor device according to the present invention, first and second gates are formed by the patterning and then an etching stop layer is formed. On the etching stop layer is formed a sacrificing layer not only to fill the gap between the first and second gates but also to planerize the surface of the resultant structure. A first impurity region is exposed by patterning the sacrificing layer and the etching stop layer, thereby forming a contact hole. A plug is formed to come into contact with the first impurity region within the contact hole. A first side wall spacer is formed by the side of the second gate with the etching stop layer being interposed between the first side wall spacer and the side of the second gate under the condition that a cell area is not covered after the sacrificing layer has been removed. A third impurity region serving as source and drain regions of a driver circuit device is then formed to be superposed on a second impurity region of a peripheral circuit area. After forming the plug, a planarization layer is formed and then an interlevel insulating layer is formed on the planarization layer.

Accordingly, since the present invention forms the sacrificing layer of only a single layer, the height of the cell area is decreased. This decreases the ratio of length to breadth of a contact hole, thus making it easy to form the contact hole. As a result, a plug is easily formed. Furthermore, since a side wall spacer is formed by the side of a second gate in a peripheral circuit area under the state that the cell area is not covered after the plug has been formed in the cell area, the number of steps is reduced. Additionally, a planarization layer and an interlevel insulating layer are sequentially formed after forming the plug, so the planarization is easily performed.

It will be apparent to those skilled in the art that various modifications and variations can be made in the method for fabricating a semiconductor device of the present invention without deviating from the spirit or scope of the invention. Thus, it is intended that the present invention covers the modifications and variations of this invention provided they come within the scope of the appended claims and their equivalents.

What is claimed is:

1. A method for fabricating a semiconductor device, said method comprising the steps of:

forming a field oxide layer on a first conduction type semiconductor substrate having a cell area and a peripheral circuit area, said field oxide layer defining active and field regions in the device;

respectively forming first and second gates having capping layers thereon in the cell and peripheral circuit areas after placing a gate insulating layer on said semiconductor substrate;

forming first and second impurity regions respectively in said cell and peripheral circuit areas by ion-implantation of a second conduction type impurity using said capping layers as a mask;

forming an etching stop layer on said semiconductor substrate to cover said field oxide layer and sides of the first and second gates, forming a sacrificing layer on said etching stop layer, and forming a contact hole exposing said first impurity region;

forming a plug contacting with said first impurity region within said contact hole and removing the remaining sacrificing layer to expose a top of said plug and said etching stop layer;

forming a third side wall spacer on an exposed side of the top of said plug while forming first and second side wall spacers such that said etching stop layer is respectively interposed between said first and second side wall spacers and the sides of said second and first gates; and forming a third impurity region to be superposed on the second impurity region of said peripheral circuit area, using said capping layer and said first side wall spacer as the mask.

2. The method as claimed in claim 1, wherein said sacrificing layer is formed to fill a gap between said first and second gates and planarize a surface.

3. The method as claimed in claim 2, wherein said sacrificing layer is formed of boro phospho silicate glass (BPSG), boro silicate glass (BSG), or phospho silicate glass (PSG).

4. The method as claimed in claim 1, wherein said contact hole is formed in a self-alignment manner.

5. The method as claimed in claim 1, wherein said plug is formed of polysilicon.

6. The method as claimed in claim 1, wherein said plug is formed of metal such as tungsten (W), titanium (Ti), cobalt (Co), platinum (Pt), or tantalum (Ta).

7. The method as claimed in claim 1, wherein said remaining sacrificing layer is removed by wet etching or combination of wet etching and dry etching.

8. The method as claimed in claim 1, wherein said etching stop layer is removed to expose said second impurity region while forming said first, second, and third side wall spacers.

9. The method as claimed in claim 8, further comprising the step of forming a buffer layer on said exposed second impurity region.

10. The method as claimed in claim 9, further comprising the step of forming said third impurity region and forming a planarization layer and an interlevel insulating layer on said buffer layer.

11. The method as claimed in claim 10, wherein said planarization layer is formed of boro phospho silicate glass (BPSG), boro silicate glass (BSG), or phospho silicate glass (PSG).

12. A method for fabricating a semiconductor device, said method comprising the steps of:

forming a field oxide layer on a first conduction type semiconductor substrate having a cell area where a memory device will be formed and a peripheral circuit area where a driver circuit device will be formed, said field oxide layer defining active and field regions in the device;

respectively forming first and second gates having capping layers thereon in the cell and peripheral circuit areas after placing a gate insulating layer on said semiconductor substrate;

forming a first impurity region which serves as source and drain regions in said cell area, and a second impurity region which serves as a lightly doped drain (LDD) region of said driver circuit device in said peripheral circuit area, by ion-implantation of a second conduction type impurity using said capping layers as a mask;

forming an etching stop layer on said semiconductor substrate to cover said field oxide layer and sides of the first and second gates and forming a sacrificing layer on said etching stop layer to fill a gap between said first and second gates and planarize a surface;

forming a contact hole by patterning said sacrificing layer and said etching stop layer in a self-alignment manner to expose said first impurity region;

forming a plug contacting with said first impurity region within said contact hole and removing the remaining sacrificing layer to expose a top of said plug and said etching stop layer;

forming a third side wall spacer on an exposed side of the top of said plug while forming first and second side wall spacers such that said etching stop layer is respectively interposed between said first and second side wall spacers and the sides of said second and first gates; and forming a third impurity region to be superposed on the second impurity region of said peripheral circuit area, using said capping layer and said first side wall spacer as the mask, said third impurity region serving as source and drain regions of said driver circuit device.

13. The method as claimed in claim 12, wherein said sacrificing layer is formed of boro phospho silicate glass (BPSG), boro silicate glass (BSG), or phospho silicate glass (PSG).

14. The method as claimed in claim 12, wherein said etching stop layer is removed to expose said second impurity region while forming said first, second, and third side wall spacers.

15. The method as claimed in claim 14, further comprising the step of forming a buffer layer on said exposed second impurity region.

16. The method as claimed in claim 15, further comprising the step of forming said third impurity region and forming a planarization layer and an interlevel insulating layer on said buffer layer.

17. A method for fabricating a semiconductor device, said method comprising the steps of:

forming a field oxide layer on a first conduction type semiconductor substrate having a cell area where a memory device will be formed and a peripheral circuit area where a driver circuit device will be formed, said field oxide layer defining active and field regions in the device;

respectively forming first and second gates having capping layers thereon in the cell and peripheral circuit areas after placing a gate insulating layer on said semiconductor substrate;

forming a first impurity region which serves as source and drain regions in said cell area, and a second impurity region which serves as a lightly doped drain (LDD) region of said driver circuit device in said peripheral circuit area, by ion-implantation of a second conduction type impurity using said capping layers as a mask;

forming an etching stop layer on said semiconductor substrate to cover said field oxide layer and sides of the first and second gates and forming a sacrificing layer on said etching stop layer to fill a gap between said first and second gates and planarize a surface;

forming a contact hole by patterning said sacrificing layer and said etching stop layer in a self-alignment manner to expose said first impurity region;

forming a plug contacting with said first impurity region within said contact hole and removing the remaining sacrificing layer to expose a top of said plug and said etching stop layer;

forming a third side wall spacer on an exposed side of the top of said plug while forming first and second side wall spacers such that said etching stop layer is respectively interposed between said first and second side wall spacers and the sides of said second and first gates; and forming a buffer layer over an entire surface of a structure described above and forming a third impurity region to be superposed on the second impurity region of said peripheral circuit area, using said capping layer and said first side wall spacer as the mask.

* * * * *